United States Patent
Sachar et al.

(10) Patent No.: US 6,670,691 B1
(45) Date of Patent: Dec. 30, 2003

(54) SHALLOW TRENCH ISOLATION FILL PROCESS

(75) Inventors: Harpreet K. Sachar, Pleasanton, CA (US); Unsoon Kim, Santa Clara, CA (US); Jack F. Thomas, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 26 days.

(21) Appl. No.: 10/174,550

(22) Filed: Jun. 18, 2002

(51) Int. Cl.[7] .......................... H01L 29/00; H01L 21/76
(52) U.S. Cl. .................. 257/510; 257/50; 257/499; 257/514; 438/410; 438/424; 438/445
(58) Field of Search .......................... 257/50, 499, 510, 257/514; 438/410, 424, 445

(56) References Cited

U.S. PATENT DOCUMENTS

| | | | | |
|---|---|---|---|---|
| 5,130,268 A | * | 7/1992 | Liou et al. ............... | 438/425 |
| 5,410,176 A | * | 4/1995 | Liou et al. ............... | 257/49 |
| 5,646,063 A | * | 7/1997 | Mehta et al. ............. | 438/425 |
| 5,702,977 A | * | 12/1997 | Jang et al. ............... | 216/38 |
| 2003/0030121 A1 | * | 2/2003 | Heo et al. ................ | 257/499 |
| 2003/0098492 A1 | * | 5/2003 | Singh et al. ............. | 257/510 |

* cited by examiner

Primary Examiner—David Nelms
Assistant Examiner—Dao H. Nguyen
(74) Attorney, Agent, or Firm—Winstead Sechrest & Minick P.C.; Robert A. Voigt, Jr.

(57) ABSTRACT

A method for filling narrow isolation trenches during a semiconductor fabrication process is disclosed. The semiconductor includes both high-aspect ratio narrow isolation trenches formed in a core area of a substrate, and wide isolation trenches formed in a circuit area of the substrate. After trench formation, a thick liner oxidation is performed in all of the isolation trenches in which a layer of thermal oxide is grown to a thickness sufficient to completely fill the high-aspect ratio narrow isolation trenches. Subsequent to the liner oxidation, the wide isolation trenches are filled with an isolation dielectric, whereby all of the trenches are uniformly filled with minimal voids.

11 Claims, 4 Drawing Sheets

SHALLOW TRENCH ISOLATION FILL PROCESS

FIELD OF THE INVENTION

The present invention relates to semiconductor processing, and more particularly to a method for filling narrow isolation trenches having high-aspect ratios.

BACKGROUND OF THE INVENTION

Transistor memory arrays are typically fabricated on a silicon wafer. The process usually begins by depositing a layer of pad oxide on the wafer substrate. A nitride mask is then deposited over the pad oxide and etched to define active regions on the silicon substrate. An isolation technology is then used to create isolation regions between the active regions to electrically isolate the active regions from one another. In shallow trench isolation (STI) for example, shallow trenches are etched into the silicon substrate in the openings in the nitride mask between the active regions. A liner oxidation process is then performed in the trenches in which a layer of thermal oxide is grown. Next, an isolation dielectric such as TEOS (tetraethyl orthosilicate) or HDP (high-density plasma) is deposited over the silicon substrate and is then polished back so that it remains only in the trenches, its top surface level with the nitride mask. After the isolation dielectric is polished back the nitride mask is stripped and layers of polysilicon are then patterned to define stacked gate structures for the semiconductor device.

Unfortunately, as device sizes become increasingly smaller, e.g., sub-half micron, the trenches in core array are scaled down in width to increase device densities while trenches in circuitry that handle high voltages are still relatively wider in width. One problem with the narrow trenches having high-aspect ratios is that it is more difficult to fill the trenches with oxide that is void-free. The consistency of void-free gap fill has a significant effect on the subsequent integration process steps and on final device yield and performance.

FIG. 1A is a top view of a silicon wafer 10 after isolation dielectric deposition, and two cross-sectional views of the wafer 10. The dotted lines in the top view are graphical representations of trench isolation areas 12 beneath the layer of isolation dielectric 14, which is shown in the cross-sectional views deposited over the nitride mask 16 to fill the trenches 12. Trench 12a is a narrow trench and trench 12b is one having a wider width. Conventional isolation dielectrics 14, such as oxide, are limited in that their capabilities are dependent upon the aspect ratios of the trenches. Therefore, when high-aspect ratio narrow trenches 12a are filled with conventional isolation dielectrics 14, defects 18 such as voids commonly form in the isolation dielectric 14. Such defects 18 in the oxide can significantly affect final device yield and performance.

Accordingly what is needed is a method for filling narrow trench isolation structures with an isolation material without the formation of voids in the insulating material. The present invention addresses such a need.

SUMMARY OF THE INVENTION

The present invention is directed to semiconductor devices that include both high-aspect ratio narrow isolation trenches formed in a core area of a substrate, and wide isolation trenches formed in a circuit area of the substrate. The present invention provides a method for filling the high-aspect ratio isolation trenches, which pose limitations to conventional isolation dielectrics in terms of gap-fill during a semiconductor fabrication process. After isolation trench formation, a thick liner oxidation is performed in all of the isolation trenches in which a layer of thermal oxide is grown to a thickness sufficient to completely fill the high-aspect ratio narrow isolation trenches. Subsequent to the liner oxidation, the wide isolation trenches are filled with an isolation dielectric, whereby all of the trenches are uniformly filled with minimal voids.

According to the method disclosed herein, the thick liner oxidation fills the high-aspect ratio narrow isolation trenches that cannot be adequately filled with a conventional isolation dielectric.

DETAILED DESCRIPTION

The present invention relates to a narrow isolation trench fill process. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention provides a method for filling narrow isolation trenches during semiconductor fabrication. In a preferred embodiment of the present invention, the isolation trench fill process is used during the fabrication of flash memory arrays in which shallow trench isolation structures are formed between active regions of the semiconductor device.

Figure 2:
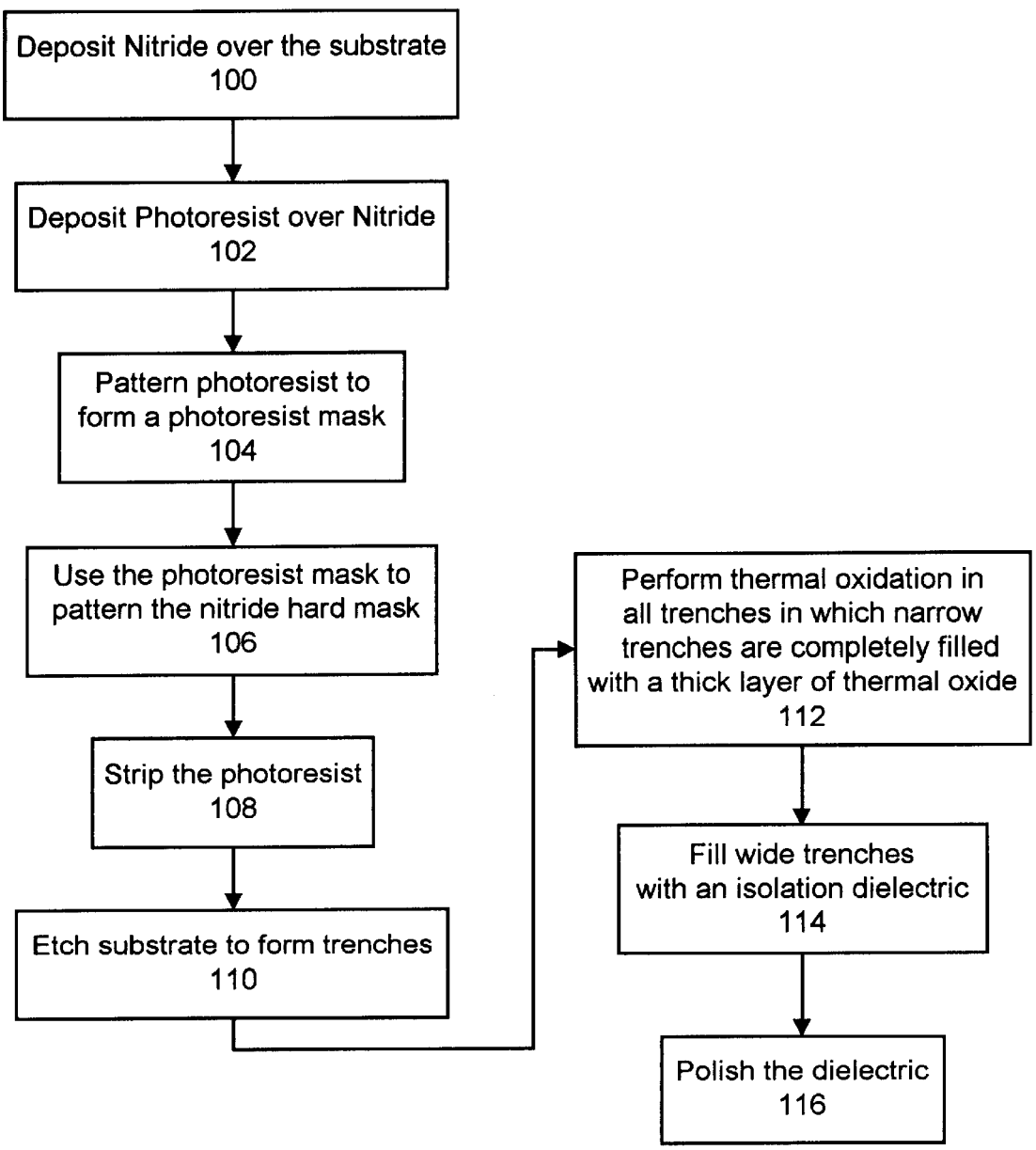
FIG. 2 is a flow chart illustrating fabrication steps used to provide isolation trenches.
Figure 3A:
FIGS. 3A–3G are cross-sectional views of the silicon substrate during the fabrication steps described in FIG. 1.
Figure 3B:
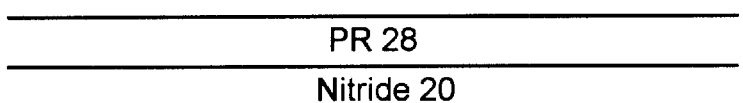
Figure 3C:
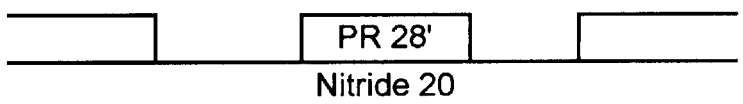
Figure 3D:
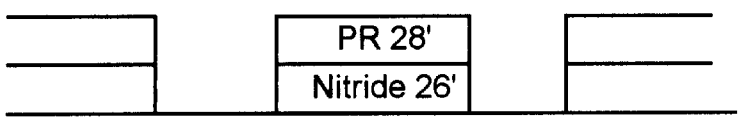
Figure 3E:
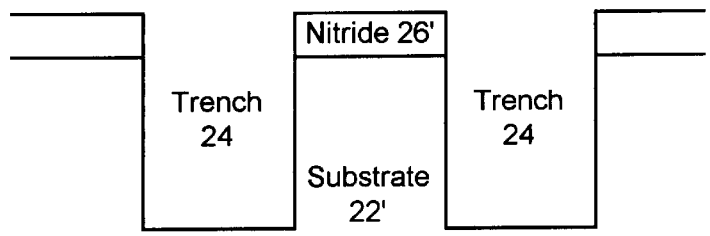

FIG. 2 is a flow chart illustrating the fabrication steps used to produce isolation trenches. FIGS. 3A–3G are cross-sectional views of the silicon substrate during the fabrication steps described in FIG. 2. The process begins by depositing a layer of pad oxide (not shown) followed by a layer of nitride 20, or other such material, over a silicon substrate 22 in step 100 to eventually form a hard mask. After the nitride 20 is deposited, a layer of photoresist 28 is deposited over the nitride 20 in step 102 (FIG. 3B). The photoresist 28 is then patterned in step 104 to form a photoresist mask 28' (FIG. 3C). The photoresist mask 28' is then used to pattern the nitride hard mask 26' in step 106 (FIG. 3D). After the nitride hard mask 26' has been patterned, the photoresist 28 is stripped in step 108. Next, in step 110, the substrate 22 is etched to form isolation trenches 24 (FIG. 3E). In a preferred embodiment, high-aspect ratio narrow trenches are formed in a core area of the substrate, while wide trenches are formed in a circuit area of the substrate.

Figure 1A:
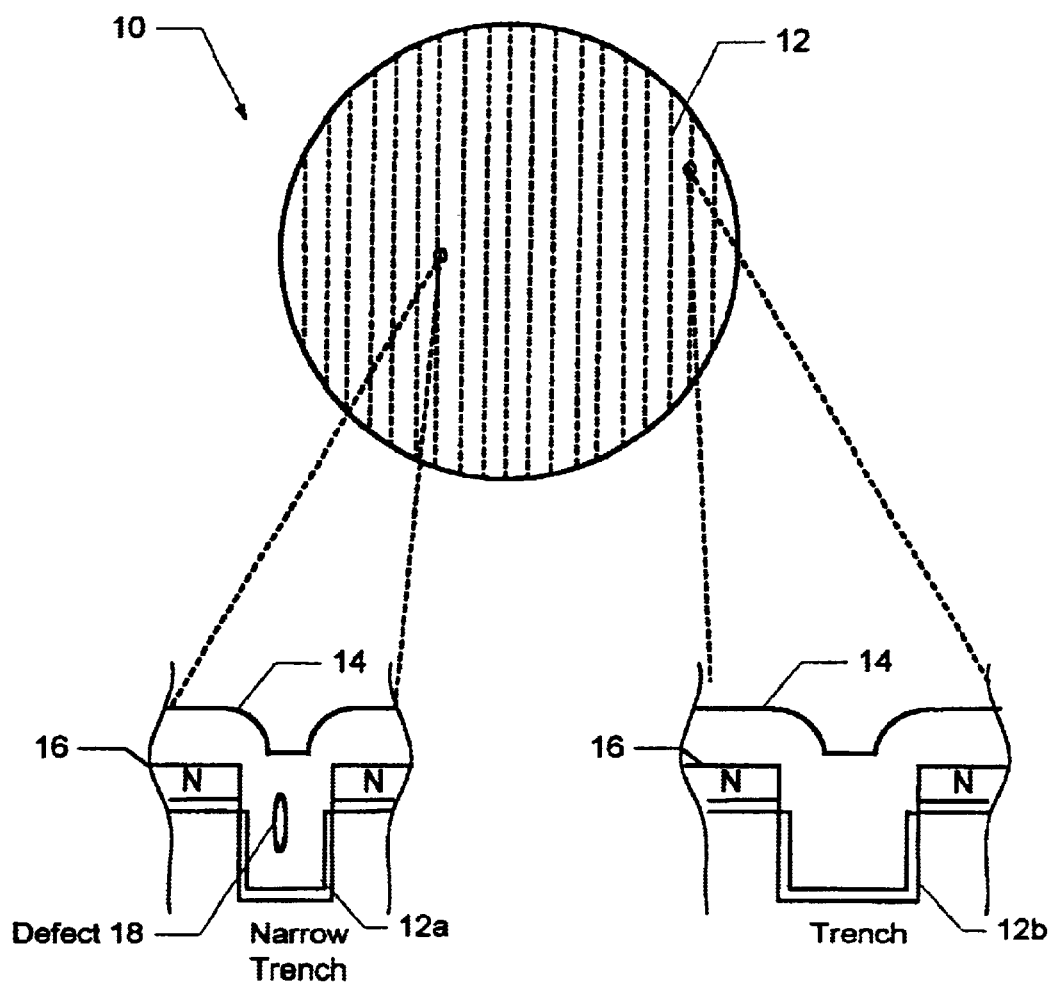
FIG. 1A is a top view of a silicon wafer after conventional oxide deposition, and two cross-sectional views of the wafer.

In a conventional process, the next step is to grow a thin thermal liner on the surface of all the isolation trenches 24, followed by filling all of the trenches 24 with an isolation dielectric, such as TEOS or HDP. However, as was discussed above and illustrated in FIG. 1, it has been observed that defects 18 in the isolation dielectric commonly occur in narrow trenches 24a having high-aspect ratios. If these voids are opened to the surface by a subsequent wet clean process and extend down into the narrow trench 24a, then subsequent deposition of materials, such as polysilicon, during fabrication may leak into the voids, significantly affecting final device yield and performance.

Figure 3F:
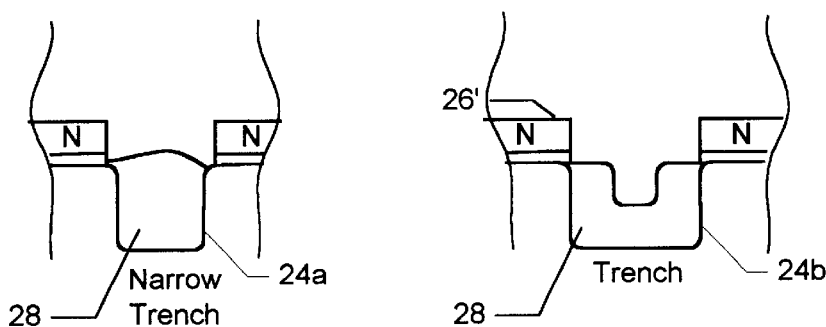

According to the present invention, an isolation trench fill process is provided that results in void-free fill for high-aspect ratio narrow trenches. The process begins in step 112 by performing a thick liner oxidation in the all of the trenches 12 that results in a thick layer of liner oxide 28 being grown to a thickness sufficient to completely fill the narrow trenches 24a (FIG. 3F). Because the width of the wider trenches 24b is greater than the narrow trenches 24a, the liner oxidation process results in a thinner layer of liner oxide being grown in the wider trenches 24b.

In a preferred embodiment, the high-aspect ratio narrow trenches 24a are ones identified as having a width of approximately less than 0.20 microns with a depth of at least 0.30 microns. As well known to those of ordinary skill in the art, trench width may be measured by CDSEM (critical dimension scanning electron microscopy). Also, in the preferred embodiment, the liner oxide 28 thickness would be required to be at least approximately one half of the narrow isolation trench 24a width to fill them completely.

Figure 3G:
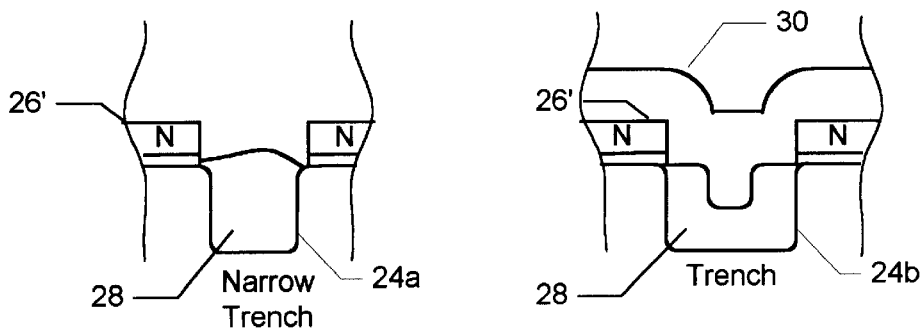

After the liner oxidation and after the narrow trenches 24a are completely filled, in step 114, an isolation dielectric 30 is deposited to fill-in the remaining wider trenches 24b (FIG. 3G). In a preferred embodiment the dielectric 30 is between 5000 to 7000 Angstroms thick to ensure trench fill in the wider trench regions. With all the trenches 12 filled uniformly with almost no voids, the device yield and performance is enhanced. After the isolation dielectric 30 is deposited, in step 116, the isolation dielectric 30 is polished back to the level of the nitride 26', and the fabrication process continues as normal.

An isolation trench fill process has been disclosed in which narrow trenches are completely filled with a thick layer of thermal oxide, while the wider isolation trenches are filled with an conventional isolation dielectric subsequent to the thermal oxidation. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for filling isolation trenches during a semiconductor fabrication process, the semiconductor having high-aspect ratio narrow isolation trenches formed in a core area of a substrate, and wide isolation trenches formed in a circuit area of the substrate, the method comprising the steps of:

(a) after isolation trench formation, performing a thick liner oxidation in all of the isolation trenches in which a layer of thermal oxide is grown to a thickness sufficient to completely fill the high-aspect ratio narrow isolation trenches; and (b) subsequent to the liner oxidation, filling the wide isolation trenches with an isolation dielectric, whereby all of the isolation trenches are uniformly filled with minimal voids.

2. The method of claim 1 wherein step (a) further includes the step of providing the high-aspect ratio narrow isolation trenches with a width of approximately less than 0.20 microns and a depth of at least 0.30 microns.

3. The method of claim 1 wherein step (b) further includes the step of depositing the isolation dielectric to a thickness of approximately between 5000 to 7000 Angstroms.

4. A method for filling isolation trenches during a semiconductor fabrication process comprising the steps of:

(a) forming high-aspect ratio narrow isolation trenches and wider trenches;

(b) providing a thick thermal liner in all of the isolation trenches in which the thermal liner is grown to a thickness sufficient to substantially completely fill the high-aspect ratio narrow trenches; and (c) subsequent to liner the oxidation, filling the wide trenches with an isolation dielectric that is approximately 5000 to 7000 Angstroms thick, whereby all of the isolation trenches are uniformly filled with minimal voids.

5. The method of claim 4, wherein step (a) further includes the step of providing the high-aspect ratio narrow trenches with a width of approximately less than 0.20 microns and a depth of at least 0.30 microns.

6. A semiconductor device comprising:

a plurality of high-aspect ratio narrow isolation trenches and a plurality of wide isolation trenches;

a layer of thermal oxide in all of the isolation trenches, wherein the thermal oxide is grown to a thickness sufficient to completely fill the high-aspect ratio narrow isolation trenches; and an isolation dielectric deposited in the wide isolation trenches to a depth sufficient to fill the wide isolation trenches, whereby all of the isolation trenches are uniformly filled with minimal voids.

7. The semiconductor device of claim 6, wherein narrow trenches are those with a width of approximately less than 0.20 microns and a depth of at least 0.30 microns.

8. The semiconductor device of claim 7, wherein isolation dielectric is approximately 5000 to 7000 Angstroms thick.

9. The semiconductor device of claim 8, wherein the semiconductor device is a flash memory array.

10. A method for filling isolation trenches during a semiconductor fabrication process, the semiconductor having high-aspect ratio narrow isolation trenches formed in a core area of a substrate, and wide isolation trenches formed in a circuit area of the substrate, the method comprising the steps of:

performing a thick liner oxidation in all of the isolation trenches in which a layer of thermal oxide is grown to a thickness sufficient to completely fill the high-aspect ratio narrow isolation trenches and to partially fill the wide isolation trenches; and filling a remaining portion of the wide isolation trenches with an isolation dielectric;

wherein all of the isolation trenches are uniformly filled with minimal voids.

11. A semiconductor device comprising:

a plurality of high-aspect ratio narrow isolation trenches and a plurality of wide isolation trenches;

a layer of thermal oxide in all of the isolation trenches, wherein the thermal oxide is grown to a thickness sufficient to completely fill the high-aspect ratio narrow isolation trenches and to partially fill the wide isolation trenches; and an isolation dielectric deposited in the wide isolation trenches to fill a remaining portion of the wide isolation trenches;

wherein all of the isolation trenches are uniformly filled with minimal voids.

* * * * *

UNITED STATES PATENT AND TRADEMARK OFFICE
CERTIFICATE OF CORRECTION

PATENT NO. : 6,670,691 B1
DATED : December 30, 2003
INVENTOR(S) : Harpreet K. Sachar, Unsoon Kim and Jack F. Thomas It is certified that error appears in the above-identified patent and that said Letters Patent is hereby corrected as shown below:

<u>Column 4,</u>
Line 12, please replace "liner the" with -- the liner --.
Line 54, following "device" please insert -- , --.

Signed and Sealed this

Sixth Day of July, 2004

JON W. DUDAS
*Acting Director of the United States Patent and Trademark Office*